US012707850B2

(12) United States Patent
Park

(10) Patent No.: US 12,707,850 B2
(45) Date of Patent: Aug. 11, 2026

(54) DISPLAY DEVICE

(71) Applicant: LG Display Co., Ltd., Seoul (KR)

(72) Inventor: TaeHan Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 375 days.

(21) Appl. No.: 18/232,001

(22) Filed: Aug. 9, 2023

(65) Prior Publication Data

US 2024/0065069 A1 Feb. 22, 2024

(30) Foreign Application Priority Data

Aug. 17, 2022 (KR) ........................ 10-2022-0102473

(51) Int. Cl.
*H01L 27/32* (2006.01)
*H10K 59/38* (2023.01)
*H10K 59/12* (2023.01)

(52) U.S. Cl.
CPC ............. *H10K 59/38* (2023.02); *H10K 59/12* (2023.02)

(58) Field of Classification Search
CPC ........ H10K 59/38; H10K 59/12; H10K 59/32; H10K 59/351; H10K 50/13; H10K 50/86
See application file for complete search history.

(56) References Cited

U.S. PATENT DOCUMENTS

2021/0074770 A1* 3/2021 Choe ....................... G02B 5/206
2021/0320265 A1* 10/2021 Song .................... H10K 85/624

FOREIGN PATENT DOCUMENTS

KR 10-2016-0000811 A 1/2018
KR 10-2018-0074644 A 7/2018
KR 10-2020-0081983 A 7/2020
KR 10-2021-0030538 A 3/2021

* cited by examiner

*Primary Examiner* — Elmito Breval
(74) *Attorney, Agent, or Firm* — Birch, Stewart, Kolasch & Birch, LLP

(57) ABSTRACT

A display device can include a substrate including first to fourth subpixels, a light emitting element disposed on the substrate, a plurality of light conversion layers disposed on the light emitting element, and a plurality of color filters disposed on the plurality of light conversion layers. The plurality of light conversion layers can include first and second light conversion layers configured to emit light having different colors. Further, in the first subpixel, the first light conversion layer can be disposed on the light emitting element and the second light conversion layer can be disposed on the first light conversion layer.

13 Claims, 18 Drawing Sheets

DISPLAY DEVICE

CROSS-REFERENCE TO RELATED APPLICATIONS

This application claims priority to the Korean Patent Application No. 10-2022-0102473 filed in the Republic of Korea on Aug. 17, 2022, the entire contents of which are hereby incorporated by reference into the present application.

BACKGROUND

Field of the Invention

The present disclosure relates to a display device.

Discussion of the Related Art

With the advancement of the information age, a demand for a display device for displaying an image has increased in various forms. Therefore, various types of display devices such as a liquid crystal display (LCD), a plasma display panel (PDP) and an electroluminescence display (ELD) have been recently used. The electroluminescence display (ELD) can include an organic light emitting display (OLED) device and a quantum-dot light emitting display (QLED).

Among the display devices, the electroluminescence display device is a self-light emitting type, and has advantages in that a viewing angle and a contrast ratio are more excellent than those of the liquid crystal display (LCD) device. Also, since the electroluminescence display device does not require a separate backlight, it is advantageous in that the electroluminescence display device can be thin and lightweight and has low power consumption. Further, the electroluminescence display device has advantages in that it can be driven at a direct current low voltage, has a fast response speed and especially has a low manufacturing cost.

Meanwhile, in a top emission structure of the related art, a color filter is formed on a light emitting element for emitting white light, so that light of a color corresponding to each subpixel is emitted. In this case, since each color filter transmits light of a specific wavelength range and shields light of the other wavelength ranges, a portion of the white light emitted from the light emitting element can transmit to the color filter, while the other portion of the white light can be shielded by the color filter. Therefore, since the light emitted from the light emitting element may not be fully used, a limitation can occur in that efficiency of light can reduced.

In addition, the color filter can transmit light of a specific wavelength range and shield light of the other wavelength ranges not only in the light emitted from the light emitting element but also in the light incident from the outside. In this case, since the light emitting element emits white light, no color filter may be formed in a white subpixel. Therefore, since the white subpixel does not shield external light, a limitation can occur in that the white subpixel can have a high reflectance.

SUMMARY OF THE DISCLOSURE

The present disclosure has been made in view of the above limitations and other issues associated with the related art.

It is an object of the present disclosure to provide a display device in which light efficiency is improved.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display device comprising a substrate including first to fourth subpixels, a light emitting element disposed on the substrate, a plurality of light conversion layers disposed on the light emitting element, and a plurality of color filters disposed on the plurality of light conversion layers, wherein the plurality of light conversion layers include first and second light conversion layers for emitting light of different colors, and in the first subpixel, the first light conversion layer is disposed on the light emitting element and the second light conversion layer is disposed on the first light conversion layer.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
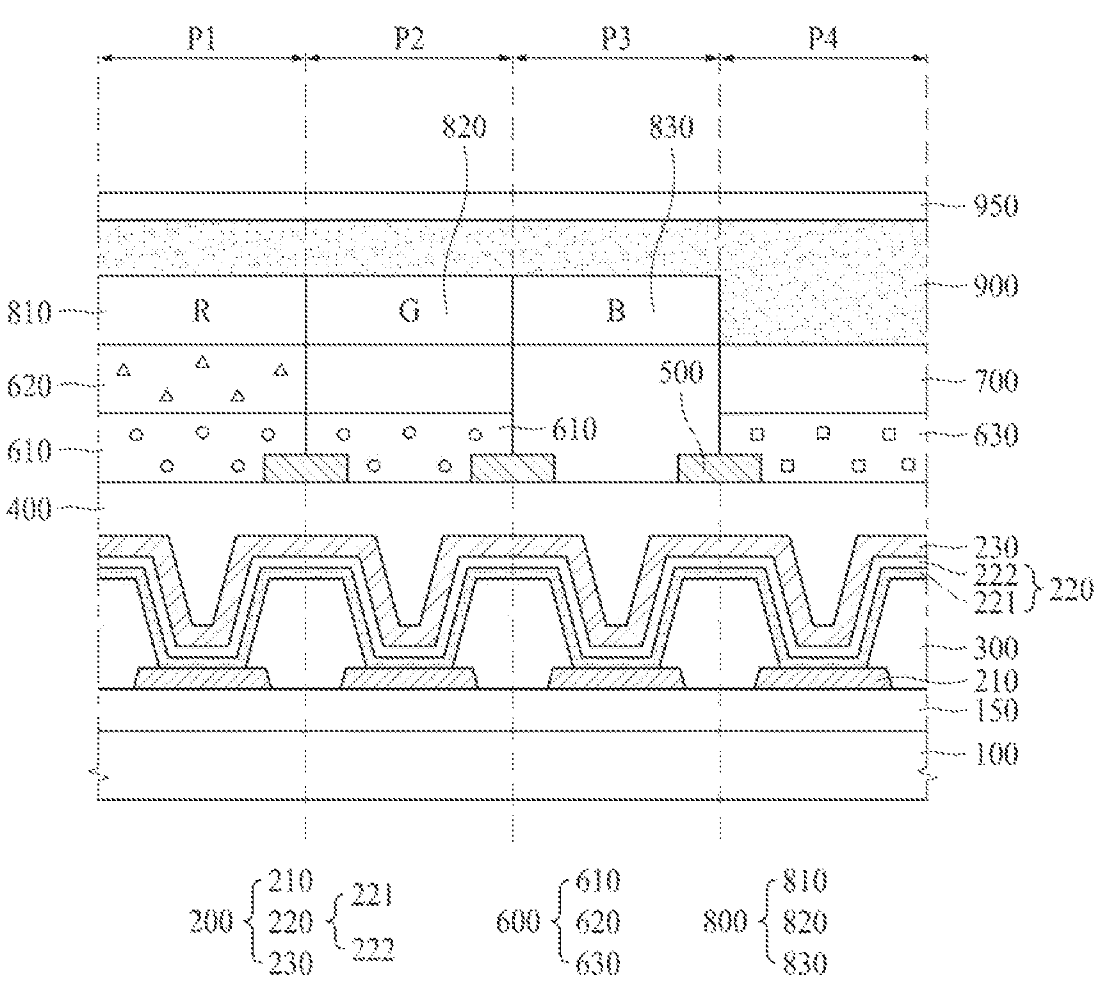
FIG. 1 is a cross-sectional view illustrating a display device according to a (1-1)th embodiment of the present disclosure.

Advantages and features of the present disclosure and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another portion can be added unless 'only' is used. The terms of a singular form can include plural forms unless referred to the contrary.

In construing an element, the element is construed as including an error band although there is no explicit description.

In describing a position relationship, for example, when the position relationship is described as 'upon,' 'above,' 'below' and 'next to,' one or more portions can be disposed between two other portions unless 'just' or 'direct' is used.

In describing a temporal relationship, for example, when the temporal order is described as "after," "subsequent," "next," and "before," a case which is not continuous can be included, unless "just" or "direct" is used. Further, the terms such as "formed," "disposed," "provided," etc. can be interchangeably used.

It will be understood that, although the terms "first," "second," etc. can be used herein to describe various elements, these elements should not be limited by these terms. These terms are only used to distinguish one element from another, and may not define order or sequence. For example, a first element could be termed a second element, and, similarly, a second element could be termed a first element, without departing from the scope of the present disclosure.

Features of various embodiments of the present disclosure can be partially or overall coupled to or combined with each other and can be variously inter-operated with each other and driven technically as those skilled in the art can sufficiently understand. The embodiments of the present disclosure can be carried out independently from each other or can be carried out together in a co-dependent relationship. Further, a term "device" is interchangeably used with a term "apparatus," etc.

Hereinafter, the embodiments of the present disclosure will be described in detail with reference to the accompanying drawings. All the components of each display device according to all embodiments of the present disclosure are operatively coupled and configured.

(1-1)th and (1-2)th Embodiments

Figure 2:
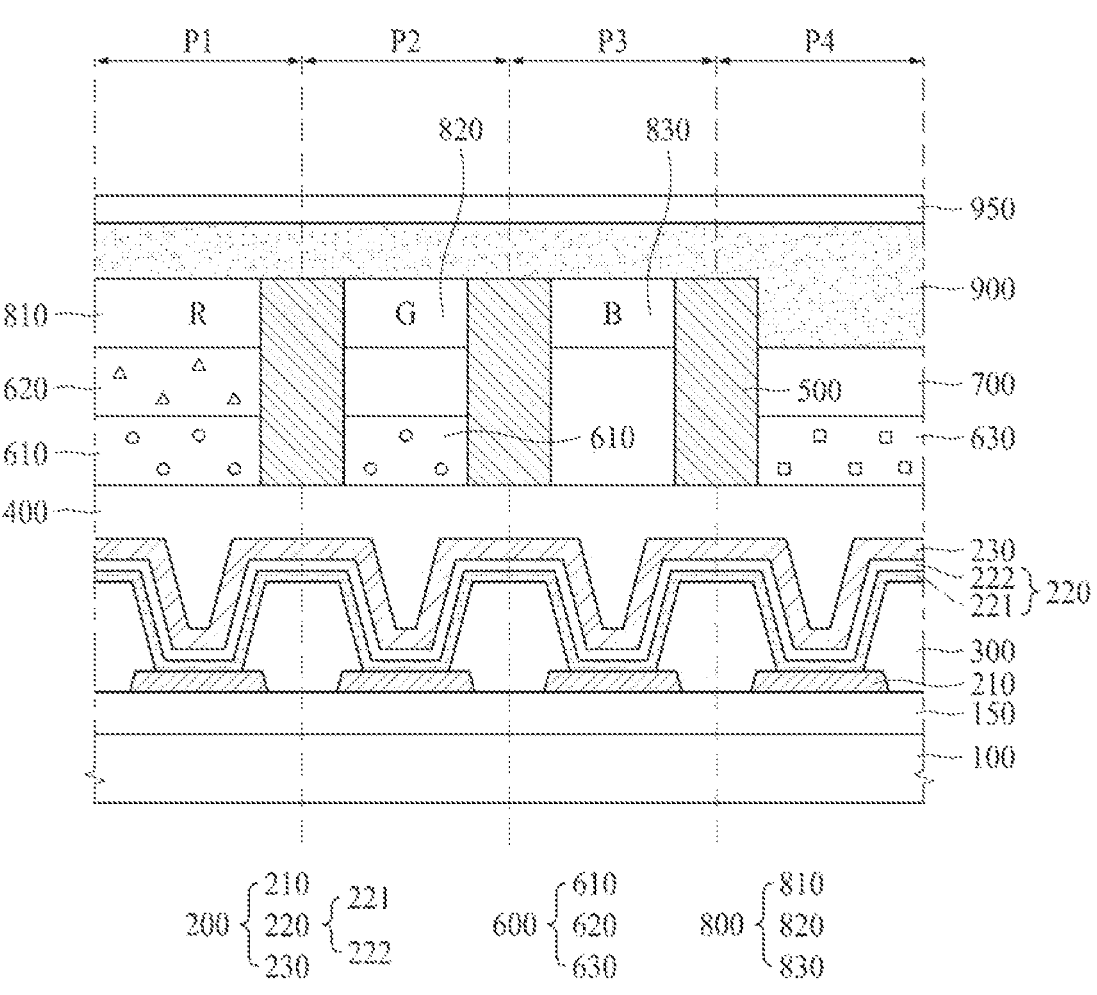
FIG. 2 is a cross-sectional view illustrating a display device according to a (1-2)th embodiment of the present disclosure.

FIG. 1 is a cross-sectional view illustrating a display device according to a (1-1)th embodiment of the present disclosure, and FIG. 2 is a cross-sectional view illustrating a display device according to a (1-2)th embodiment of the present disclosure.

Referring to FIGS. 1 and 2, a display device according to the (1-1)th and (1-2)th embodiments of the present disclosure includes a substrate 100, a circuit element layer 150, a light emitting element 200, a bank 300, an encapsulation layer 400, a black matrix 500, a light conversion layer 600, a transparent layer 700 and a color filter 800.

The substrate 100 can be formed of glass or plastic, but is not limited thereto. The display device according to the (1-1)th and (1-2)th embodiment of the present disclosure can be provided in a top emission mode in which emitted light is emitted toward an upper portion. Therefore, an opaque material as well as a transparent material can be used as a material of the substrate 100.

First to fourth subpixels P1 to P4 can be formed on the substrate 100. The first subpixel P1 can be formed to emit red (R) light, the second subpixel P2 can be formed to emit green (G) light, the third subpixel P3 can be formed to emit blue (B) light, and the fourth subpixel P4 can be formed to emit white (W) light, but the present disclosure is not limited thereto. Various modifications can be made in the arrangement order of the first to fourth subpixels P1 to P4.

The circuit element layer 150 can be formed on the substrate 100. The circuit element layer 150 can be provided with a circuit element, which includes various signal lines, a thin film transistor and a capacitor, for each of the subpixels P1 to P4. The signal lines can include a gate line, a data line, a power line and a reference line, and the thin film transistor can include a switching thin film transistor, a driving thin film transistor and a sensing thin film transistor.

The switching thin film transistor can be switched in accordance with a gate signal supplied to the gate line to supply a data voltage supplied from the data line to the driving thin film transistor. The driving thin film transistor can be switched in accordance with the data voltage supplied from the switching thin film transistor to generate a data current from a power source supplied from the power line and supply the data current to a first electrode 210. The sensing thin film transistor can sense a threshold voltage deviation of the driving thin film transistor, which causes degradation of image quality, and can supply the current of the driving thin film transistor to the reference line in response to a sensing control signal supplied from the gate line or a separate sensing line.

The capacitor can maintain the data voltage supplied to the driving thin film transistor for one frame, and can be connected to each of a gate terminal and a source terminal of the driving thin film transistor.

The light emitting element 200 can be formed on the circuit element layer 150. The light emitting element 200 can include a first electrode 210, a light emitting layer 220, and a second electrode 230.

The first electrode 210 can be formed on the circuit element layer 150. The first electrode 210 is formed in each of the first to fourth subpixels P1 to P4, and can serve as an anode of the display device. The first electrode 210 can be electrically connected to the driving thin film transistor formed in the circuit element layer 150.

The first electrode 210 can include a transparent conductive material. For example, the first electrode 210 can include a transparent conductive material such as Indium Tin Oxide (ITO) or Indium Zinc Oxide (IZO). Alternatively, the first electrode 210 can include a metal material such as Al, Ag, Cu, Mo, Ti, W or Cr or their alloy. In addition, the first electrode 210 is shown as a single layer, but can be formed as multiple layers. For example, the first electrode 210 can be formed as a triple layer in which a transparent conductive material, a metal material and a transparent conductive material are sequentially stacked.

The bank 300 can be formed at a boundary between the first to fourth subpixels P1 to P4 to define a light emission area in each of the first to fourth subpixels P1 to P4. For example, an opening area in which the bank 300 is not formed in each of the first to fourth subpixels P1 to P4 can be a light emission area. In addition, the bank 300 can be formed to cover an end of the first electrode 210.

The bank 300 can include an organic insulating material such as acryl resin, epoxy resin, phenolic resin, polyamide resin and polyimide resin. Alternatively, the bank 300 can include an inorganic insulating material such as silicon nitride, aluminum nitride, zirconium nitride, titanium nitride, hafnium nitride, tantalum nitride, silicon oxide, aluminum oxide or titanium oxide. In addition, the bank 300 can be formed to include a black dye in order to absorb light incident from the outside.

The light emitting layer 220 can be formed on the first electrode 210. In addition, the light emitting layer 220 can be also formed on the bank 300 and thus can be continuously formed in the first to fourth subpixels P1 to P4 and a boundary area therebetween.

The light emitting layer 220 can include a first light emitting layer 221 and a second light emitting layer 222. The first light emitting layer 221 can be formed on the first electrode 210, and the second light emitting layer 222 can be formed on the first light emitting layer 221.

Each of the first and second light emitting layers 221 and 222 can include a hole transport layer, an organic light emitting layer and an electron transport layer. In this case, when a voltage is applied to the first electrode 210 and the second electrode 230, holes and electrons move to the light emitting layer 220 through the hole transport layer and the electron transport layer, respectively and are combined with each other in the light emitting layer 220 to emit light.

The first light emitting layer 221 and the second light emitting layer 222 can emit light of different colors. The first light emitting layer 221 can emit blue (B) light, and the second light emitting layer 222 can emit green (G) light, but the present disclosure is not limited thereto.

The second electrode 230 can be formed on the light emitting layer 220. The second electrode 230 can serve as a cathode of the display device. In the same manner as the light emitting layer 220, the second electrode 230 can be formed in the first to fourth subpixels P1 to P4 and the boundary area therebetween. For example, the second electrode 230 can be also formed on the first electrode 210 and the bank 300.

Since the display device according to the (1-1)th and (1-2)th embodiments of the present disclosure is provided in a top emission mode, the second electrode 230 can include a transparent conductive material such as indium tin oxide (ITO) or indium zinc oxide (IZO) to transmit the light emitted from the light emitting layer 220 to the upper portion. The second electrode 230 can be formed of a single layer or multiple layers.

The encapsulation layer 400 can be formed on the second electrode 230 to prevent external moisture from being permeated into the light emitting layer 220. The encapsulation layer 400 can be formed of an inorganic insulating material such as a silicon oxide layer ($SiO_X$) or a silicon nitride layer ($SiN_X$). Alternatively, the encapsulation layer 400 can include an organic insulating material such as acryl resin, epoxy resin, phenolic resin, polyamide resin or polyimide resin.

The black matrix 500 can be formed on the encapsulation layer 400. The black matrix 500 can be formed at the boundary between the first to fourth subpixels P1 to P4 in a matrix structure to prevent light leakage from occurring at the boundary between the first to fourth subpixels P1 to P4.

The light conversion layer 600, the transparent layer 700 and the color filter 800 can be formed on the encapsulation layer 400 and the black matrix 500. The light conversion layer 600 can include first to third light conversion layers 610 to 630. In addition, the color filter 800 can include first to third color filters 810 to 830. A stacked structure of the light conversion layer 600, the transparent layer 700 and the color filter 800 can be different in each of the first to fourth subpixels P1 to P4.

The first subpixel P1 can include a first light conversion layer 610, a second light conversion layer 620 and a first color filter 810. In an area of the first subpixel P1, the first light conversion layer 610 can be formed on the encapsulation layer 400 or the black matrix 500, the second light conversion layer 620 can be formed on the first light conversion layer 610, and the first color filter 810 can be formed on the second light conversion layer 620.

In detail, referring to FIG. 1, the first light conversion layer 610, the second light conversion layer 620 and the first color filter 810 can be formed to overlap a portion of the black matrix 500. For example, a thickness of the black matrix 500 can be smaller than that of the first light conversion layer 610, and the first light conversion layer 610 can cover an end of the black matrix 500, but is not limited thereto. For example, the thickness of the black matrix 500 can be greater than that of the first light conversion layer 610 and can be smaller than a sum of the thicknesses of the first and second light conversion layers 610 and 620, and the second light conversion layer 620 can cover the end of the black matrix 500.

Alternatively, the first light conversion layer 610, the second light conversion layer 620 and the first color filter 810 can be formed so as not to overlap the black matrix 500. Referring to FIG. 2, sides of the first light conversion layer 610, the second light conversion layer 620 and the first color filter 810 can be in contact with a side of the black matrix 500. In addition, the thickness of the black matrix 500 can be equal to a sum of the thicknesses of the first light conversion layer 610, the second light conversion layer 620 and the first color filter 810. For example, an upper surface of the black matrix 500 and an upper surface of the first color filter 810 can be positioned on the same plane, but the present disclosure is not limited thereto. As shown in FIG. 2, the side of the black matrix 500 is formed to be in contact with the sides of the first and second light conversion layers 610 and 620, whereby light loss caused by scattering of light to the sides of the first and second light conversion layers 610 and 620 can be minimized. Therefore, light efficiency can be effectively improved.

The first light conversion layer 610 can include a color conversion material such as a quantum dot. The color conversion material can absorb light of a specific wavelength range and convert the absorbed light into light having a wavelength range different from that of the absorbed light, thereby emitting the converted light. In this case, the first light conversion layer 610 can absorb blue (B) light and convert the blue (B) light into green (G) light to emit the green (G) light. Therefore, the blue (B) light emitted from the first light emitting layer 221 can be absorbed by the first light conversion layer 610 and converted into green (G) light, whereby the green (G) light can be emitted. In addition, the green (G) light emitted from the second light emitting layer 222 can be emitted as it is without being converted into another color. For example, in the first subpixel P1, the light that has passed through the first light conversion layer 610 can be the green (G) light.

The second light conversion layer 620 can emit light of a color different from that of the first light conversion layer 610. In this case, the second light conversion layer 620 can convert green (G) light into red (R) light and emit the red (R) light. Therefore, the green (G) light that has passed through the first light conversion layer 610 can be absorbed by the second light conversion layer 620 and converted into red (R) light, whereby the red light can be emitted. For example, in the first subpixel P1, the light that has passed through the second light conversion layer 620 can be the red (R) light.

The first color filter 810 can transmit only red (R) light. As described above, since the light that has passed through the second light conversion layer 620 is red (R) light, the light that has passed through the second light conversion layer 620 can transmit the first color filter 810. In addition, when light of a color different from that of the red (R) light without being converted into red (R) right by the first and second light conversion layers 610 and 620 exists, the light of a color different from the red (R) can be shielded by the first color filter 810. Therefore, the first subpixel P1 can emit the red (R) light by the first color filter 810.

Therefore, the first subpixel P1 can convert the light emitted from the light emitting layer 220 into light of the same color as that of the first color filter 810 using the first and second light conversion layers 610 and 620. For example, since the blue (B) light and the green (G) light, which are emitted from the light emitting layer 220, are converted into the red (R) light, all of the light emitted from the light emitting layer 220 can be emitted by transmitting the first color filter 810. Therefore, loss of the light shielded by the first color filter 810 among the light emitted from the light emitting layer 220 can be minimized. For example, since the amount of light passing through the first color filter 810 is increased, efficiency of light of the display device is improved.

The second subpixel P2 can include a first light conversion layer 610, a transparent layer 700, and a second color filter 820. In an area of the second subpixel P2, the first light conversion layer 610 can be formed on the encapsulation layer 400 and the black matrix 500, the transparent layer 700 can be formed on the first light conversion layer 610, and the second color filter 820 can be formed on the transparent layer 700.

In detail, referring to FIG. 1, the first light conversion layer 610, the transparent layer 700 and the second color filter 820 can be formed to overlap a portion of the black matrix 500. For example, the thickness of the black matrix 500 can be smaller than that of the first light conversion layer 610, and the first light conversion layer 610 can cover the end of the black matrix 500, but is not limited thereto. For example, the thickness of the black matrix 500 can be greater than that of the first light conversion layer 610 and can be smaller than a sum of the thicknesses of the first light conversion layers 610 and the transparent layer 700, and the transparent layer 700 can cover the end of the black matrix 500. In this case, the first light conversion layers 610 formed in the first and second subpixels P1 and P2 can be adjacent to each other in the boundary area of the first and second subpixels P1 and P2. In addition, the second light conversion layer 620 formed in the first subpixel P1 can be adjacent to the transparent layer 700 formed in the second subpixel P2 in the boundary area of the first and second subpixels P1 and P2.

Alternatively, the first light conversion layer 610, the transparent layer 700 and the second color filter 820 can be formed so as not to overlap the black matrix 500. Referring to FIG. 2, sides of the first light conversion layer 610, the transparent layer 700 and the second color filter 820 can be in contact with the side of the black matrix 500. In addition, the thickness of the black matrix 500 can be equal to a sum of the thicknesses of the first light conversion layer 610, the transparent layer 700 and the second color filter 820. For example, the upper surface of the black matrix 500 and an upper surface of the second color filter 820 can be positioned on the same plane, but the present disclosure is not limited thereto. As shown in FIG. 2, the side of the black matrix 500 is formed to be in contact with the side of the first light conversion layer 610, whereby light loss caused by scattering of light to the side of the first light conversion layer 610 can be minimized. Therefore, light efficiency can be effectively improved.

The first light conversion layer 610 formed in the second subpixel P2 can be formed of the same material and thickness as those of the first light conversion layer 610 formed in the first subpixel P1. For example, in the same manner as the first light conversion layer 610 formed in the first subpixel P1, the first light conversion layer 610 formed in the second subpixel P2 can absorb blue (B) light and convert the blue (B) light into green (G) light to emit the green (G) light. Therefore, the blue (B) light emitted from the first light emitting layer 221 can be absorbed by the first light conversion layer 610 and converted into the green (G) light, whereby the green (G) light can be emitted. In addition, the green (G) light emitted from the second light emitting layer 222 can be emitted as it is without being converted into another color. For example, in the second subpixel P2, the light that has passed through the first light conversion layer 610 can be the green (G) light.

The transparent layer 700 can be made of a transparent material so that the light emitted from the first light conversion layer 610 transmits there. For example, the green (G) light emitted from the first light conversion layer 610 can be emitted to the second color filter 820 by transmitting the transparent layer 700. The transparent layer 700 can include an inorganic insulating material such as a silicon oxide layer ($SiO_X$) or a silicon nitride layer ($SiN_X$). Alternatively, the transparent layer 700 can include an organic insulating material such as acryl resin, epoxy resin, phenolic resin, polyamide resin or polyimide resin. In addition, the transparent layer 700 can be formed to have the same thickness as that of the second light conversion layer 620 of the first subpixel P1, but is not limited thereto.

The second color filter 820 can transmit only green (G) light. As described above, since the light that has passed through the first light conversion layer 610 is green (G) light, the light that has passed through the first light conversion layer 610 can transmit the second color filter 820. In addition, when light of a color different from that of the green (G) without being converted into green (G) right by the first light conversion layer 610 exists, the light of a color different from the green (G) can be shielded by the second color filter 820. Therefore, the second subpixel P2 can emit the green (G) light by the second color filter 820.

Therefore, the second subpixel P2 can convert the light emitted from the light emitting layer 220 into light of the same color as that of the second color filter 820 through the first light conversion layer 610. For example, since the blue (B) light emitted from the light emitting layer 220 is fully converted into the green (G) light, the light emitted from the light emitting layer 220 can be emitted by transmitting the second color filter 820. Therefore, loss of the light shielded by the second color filter 820 among the light emitted from the light emitting layer 220 can be minimized. For example, since the amount of light passing through the second color filter 820 is increased, efficiency of light of the display device is improved. For example, when light efficiency of the conventional display device is about 36%, light efficiency of the display device according to the (1-1)th and (1-2)th embodiments of the present disclosure can be 68.4% improved as much as about 188%.

The third subpixel P3 can include a transparent layer 700 and a third color filter 830. In an area of the third subpixel P3, the transparent layer 700 can be formed on the encapsulation layer 400 and the black matrix 500, and the third color filter 830 can be formed on the transparent layer 700.

In detail, referring to FIG. 1, the transparent layer 700 and the third color filter 830 can be formed to overlap a portion of the black matrix 500. For example, the thickness of the black matrix 500 can be smaller than that of the transparent layer 700, and the transparent layer 700 can cover the end of the black matrix 500. In this case, the first light conversion layers 610 and the transparent layer 700, which are formed in the second subpixel P2, can be adjacent to the transparent layer 700 formed in the third subpixel P3 in the boundary area of the second and third subpixels P2 and P3.

Alternatively, the transparent layer 700 and the third color filter 830 can be formed so as not to overlap the black matrix 500. Referring to FIG. 2, sides of the transparent layer 700 and the third color filter 830 can be in contact with the side of the black matrix 500. In addition, the thickness of the black matrix 500 can be equal to a sum of the thicknesses of the transparent layer 700 and the third color filter 830. For example, the upper surface of the black matrix 500 and an upper surface of the third color filter 830 can be positioned on the same plane, but the present disclosure is not limited thereto.

The transparent layer 700 of the third subpixel P3 can be formed of the same material as that of the transparent layer 700 of the second subpixel P2. For example, in the same manner as the transparent layer 700 of the second subpixel P2, the blue (B) light and the green (G) light, which are emitted from the light emitting layer 220, can be emitted to the third color filter 830 by transmitting the transparent layer 700. In addition, a thickness of the transparent layer 700 of the third subpixel P3 can be the same as a sum of thicknesses of the first light conversion layer 610 and the transparent layer 700 of the second subpixel P2, but is not limited thereto.

The third color filter 830 can transmit only blue (B) light. Therefore, the blue (B) light emitted from the first light emitting layer 221 can transmit the third color filter 830, and the green (G) light emitted from the second light emitting layer 222 can be shielded by the third color filter 830. Therefore, the third subpixel P3 can emit the blue (B) light by the third color filter 830.

The fourth subpixel P4 can include a third light conversion layer 630 and a transparent layer 700. In an area of the fourth subpixel P4, the third light conversion layer 630 can be formed on the encapsulation layer 400 and the black matrix 500, and the transparent layer 700 can be formed on the third light conversion layer 630.

In detail, referring to FIG. 1, the third light conversion layer 630 and the transparent layer 700 can be formed to overlap a portion of the black matrix 500. For example, the thickness of the black matrix 500 can be smaller than that of the third light conversion layer 630, and the third light conversion layer 630 can cover the end of the black matrix 500. In this case, the transparent layer 700 formed in the third subpixel P3 can be adjacent to the third light conversion layer 630 and the transparent layer 700, which are formed in the fourth subpixel P4, in the boundary area of the third and fourth subpixels P3 and P4.

Alternatively, the third light conversion layer 630 and the transparent layer 700 can be formed so as not to overlap the black matrix 500. Referring to FIG. 2, sides of the third light conversion layer 630 and the transparent layer 700 can be in contact with the side of the black matrix 500. In addition, the thickness of the black matrix 500 can be greater than a sum of the thicknesses of the third light conversion layer 630 and the transparent layer 700. As shown in FIG. 2, the side of the black matrix 500 is formed to be in contact with the side of the third light conversion layer 630, whereby light loss caused by scattering of light to the side of the third light conversion layer 630 can be minimized. Therefore, light efficiency can be effectively improved.

The third light conversion layer 630 can be formed of the same material and thickness as those of the second light conversion layer 620. For example, in the same manner as the second light conversion layer 620, the third light conversion layer 630 can absorb green (G) light and convert the green light into red (R) light to emit the red light. At this time, light conversion rates of the third light conversion layer 630 and the second light conversion layer 620 can be different from each other. As described above, the second light conversion layer 620 can fully absorb the green (G) light emitted from the second light emitting layer 222 and convert the green light into red (R) right to emit the red (R) light, but the third light conversion layer 630 can absorb only a portion of the green (G) light emitted from the second light emitting layer 222 and convert the portion of the green (G) light into red (R) right to emit the red (G) light. Therefore, the light conversion rate of the third light conversion layer 630 can be smaller than that of the second light conversion layer 620.

Therefore, the blue (B) light emitted from the first light emitting layer 221 can be emitted as it is by transmitting the third light conversion layer 630. A portion of the green (G) light emitted from the second light emitting layer 222 can be absorbed by the third light conversion layer 630 and converted into the red (R) light, whereby the red light can be emitted. The other portion of the green (G) light emitted from the second light emitting layer 222 can be emitted as it is by transmitting the third light conversion layer 630. For example, in the fourth subpixel P4, the blue (B) light emitted from the first emission layer 221, the green (G) light emitted from the second emission layer 222 and the red (R) light converted by the third light conversion layer 630 can be simultaneously emitted. Therefore, since the fourth subpixel P4 simultaneously emits red (R) light, green (G) light and blue (B) light, white (W) light can be emitted.

Since the red (R) light can be emitted through the third light conversion layer 630, a subpixel for emitting white (W) can be formed even though a light emitting layer for emitting red (R) light is not additionally formed. In this subpixel structure, power consumption can be more reduced than a subpixel structure in which only red (R) light, green (G) light and blue (B) light are only emitted. In addition, reflectance caused by external light is increased due to light of a green (G) wavelength range among external light. However, in the present disclosure, since green (G) light introduced from the outside is converted into red (R) light by the third light conversion layer 630, reflectance can be reduced.

The transparent layer 700 formed in the fourth subpixel P4 can be formed of the same material and thickness as those of the transparent layer 700 formed in the second subpixel P2. In addition, since the white (W) light emitted by the light emitting layer 220 and the second light conversion layer 620 passes through the transparent layer 700, the fourth subpixel P4 can emit the white (W) light.

An adhesive 900 and an absorption film 950 can be formed on the transparent layer 700 and the color filter 800. The adhesive 900 can be formed on an entire surface of the first to fourth subpixels P1 to P4 so that an upper surface of the adhesive 900 is flat. Since the color filter is not formed in the fourth subpixel P4 for emitting white (W) light, a thickness of the adhesive 900 formed in the fourth subpixel P4 can be greater than that of the adhesive 900 formed in the first to third subpixels P1 to P3.

The absorption film 950 can be formed on the adhesive 900, and can be formed on the entire surface of the first to fourth subpixels P1 to P4. In the related art, a polarizing plate can be attached to the upper portion of the display device so as to minimize inflow of external light, but the polarizing plate can have an issue of reducing overall luminance of the display device. Therefore, in the present disclosure, the polarizing plate is omitted and the absorption film 950 is formed, so that inflow of external light can be avoided and luminance reduction can be minimized. Also, the absorption film 950 can be stably attached to the transparent layer 700 and the color filter 800 by the adhesive 900.

Consequently, in the present disclosure, a plurality of light conversion layers 600 can be formed for each subpixel P, so that a color of light emitted from the light emitting layer 220 and a color of light capable of being transmitted to the color filter 800 can be matched with each other, whereby light efficiency can be increased. In particular, in case of the white (W) subpixel, even though a light emitting layer for emitting red (R) light is omitted, a subpixel for emitting white (W) light can be implemented, and the green (G) light introduced from the outside can be converted into the red (R) light to reduce reflectance.

(2-1)th and (2-2)th Embodiments

Figure 3:
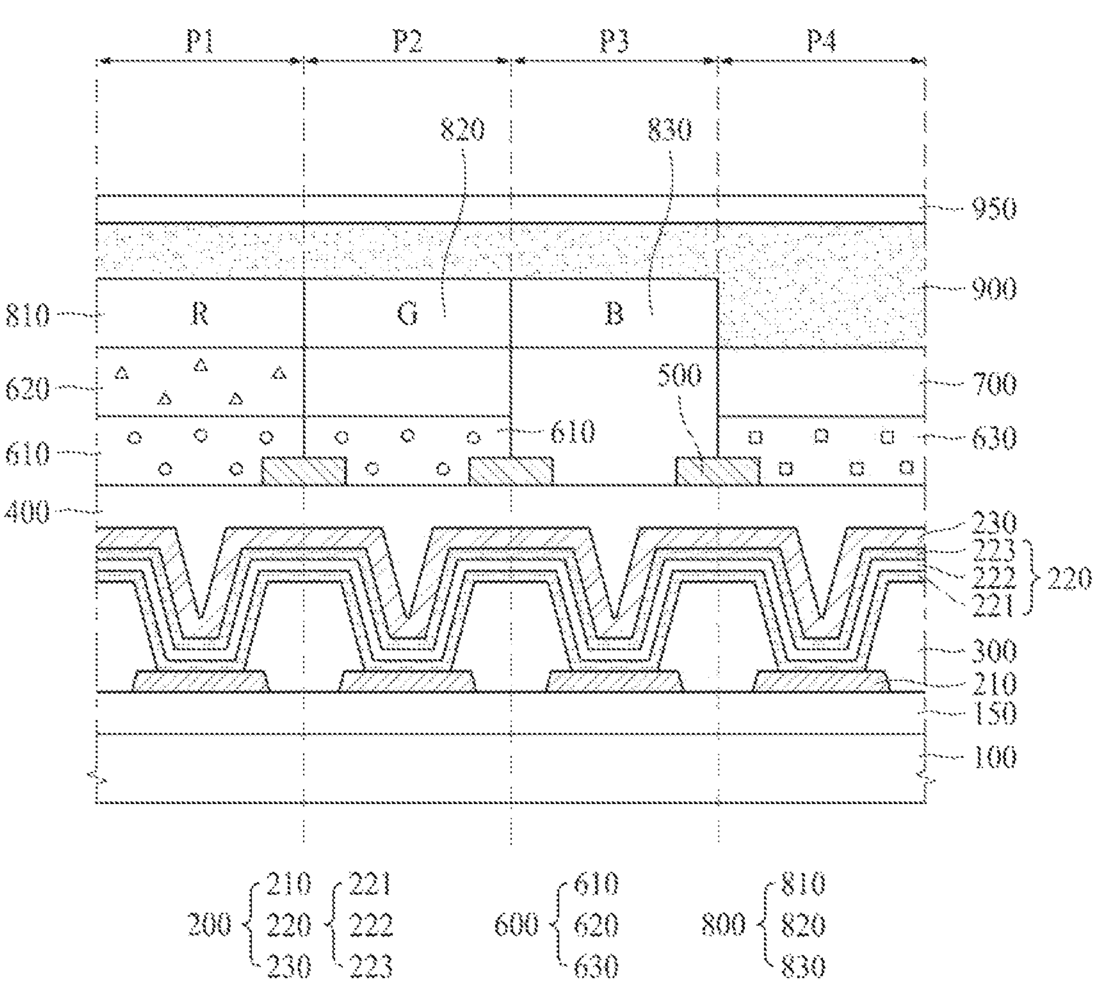
FIG. 3 is a cross-sectional view illustrating a display device according to a (2-1)th embodiment of the present disclosure.
Figure 4:
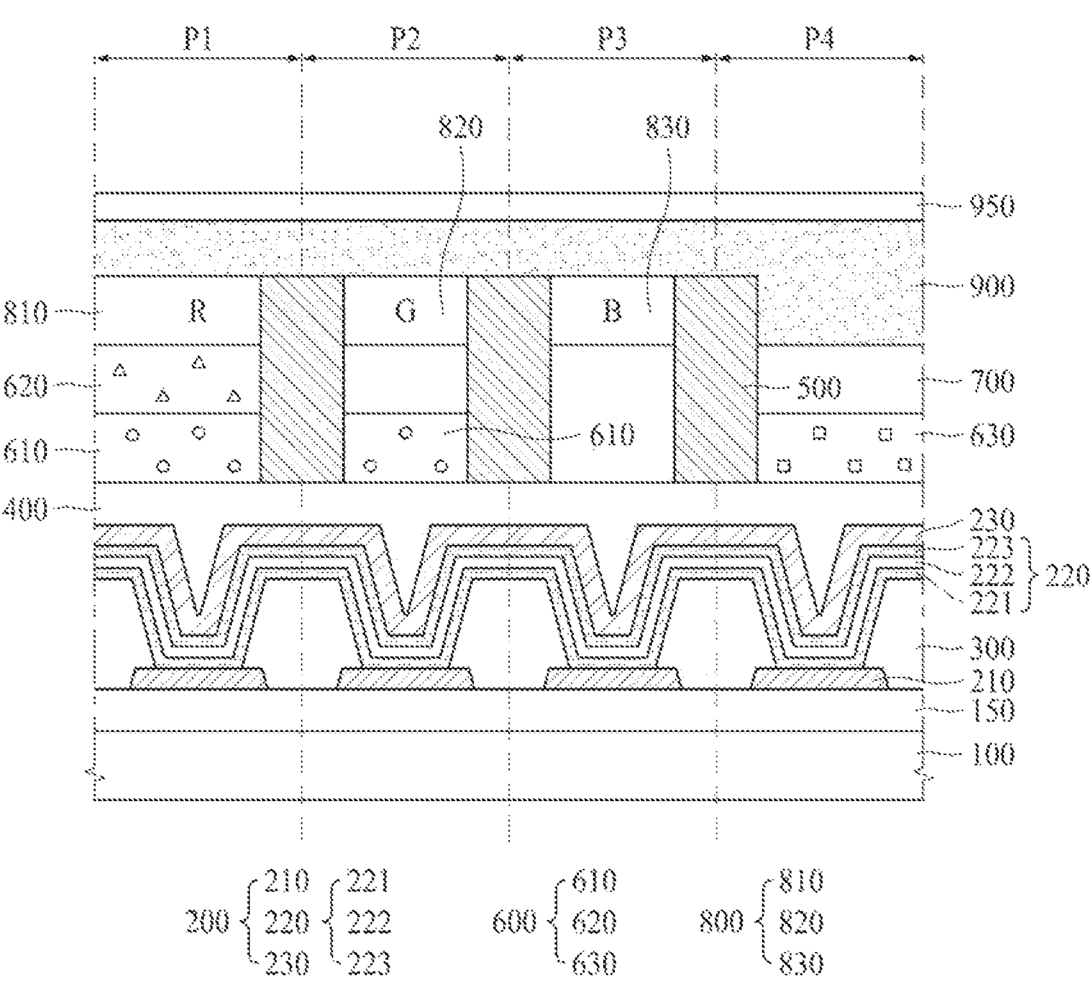
FIG. 4 is a cross-sectional view illustrating a display device according to a (2-2)th embodiment of the present disclosure.

FIG. 3 is a cross-sectional view illustrating a display device according to a (2-1)th embodiment of the present disclosure, and FIG. 4 is a cross-sectional view illustrating a display device according to a (2-2)th embodiment of the present disclosure.

The display device according to FIGS. 3 and 4 has substantially the same structure as that of the display device according to FIGS. 1 and 2 except for the structure of the light emitting layer 220. Therefore, the same elements as those of the display device shown in FIGS. 1 and 2 are denoted by the same reference numerals and their repeated description will be omitted or may be briefly discussed.

As described above, referring to FIGS. 3 and 4, the light emitting element 200 can be formed on the circuit element layer 150. The light emitting element 200 can include a first electrode 210, a light emitting layer 220, and a second electrode 230.

The light emitting layer 220 can further include a third light emitting layer 223. As described above, the first light emitting layer 221 can be formed on the first electrode 210, and the second light emitting layer 222 can be formed on the first light emitting layer 221. In addition, the third light emitting layer 223 can be formed on the second light emitting layer 222.

Each of the first to third light emitting layers 221 to 223 can include a hole transport layer, an organic light emitting layer and an electron transport layer. In this case, when a voltage is applied to the first electrode 210 and the second electrode 230, holes and electrons move to the light emitting layer through the hole transport layer and the electron transport layer, respectively, and can be combined with each other in the light emitting layer to emit light.

As described above, the first light emitting layer 221 can emit blue (B) light, and the second light emitting layer 222 can emit green (G) light. In addition, the third light emitting layer 223 can emit blue (B) light. For example, as compared with the light emitting layer 220 of the (1-1)th and (1-2)th embodiments, the light emitting layer 220 of the (2-1)th and (2-2)th embodiments can further include a third light emitting layer 223 for emitting blue (B) light. Therefore, the amount of blue (B) light emitted from the light emitting layer 220 of the (2-1)th and (2-2)th embodiments can be increased as compared with the (1-1)th and (1-2)th embodiments.

As described above, the first light conversion layer 610 formed in the first and second subpixels P1 and P2 can convert blue (B) light emitted from the light emitting layer 220 into green (G) light. In this case, since the amount of blue (B) light emitted from the (2-1)th and (2-2)th embodiments is greater than that in the (1-1)th and (1-2)th embodiments, the amount of light converted into green (G) light by the first light conversion layer 610 can be also increased. Therefore, the amount of red (R) light and green (G) light, which are emitted from the first and second subpixels P1 and P2, can be increased.

In addition, the third color filter 830 formed in the third subpixel P3 can transmit only blue (B) light. In this case, since the amount of blue (B) light emitted from the (2-1)th and (2-2)th embodiments is greater than that in the (1-1)th and (1-2)th embodiments, the amount of blue (B) light transmitting the third color filter 830 can be also increased. Therefore, the amount of blue (B) light emitted from the third subpixel P3 can be increased.

Consequently, as compared with the (1-1)th and (1-2)th embodiments, the (2-1)th and (2-2)th embodiments additionally disclose a third light emitting layer 223 for emitting blue (B) light, so that the amount of light emitted from each subpixel can be increased. Therefore, light efficiency of the display device can be further increased.

(3-1)th and (3-2)th Embodiments

Figure 5:
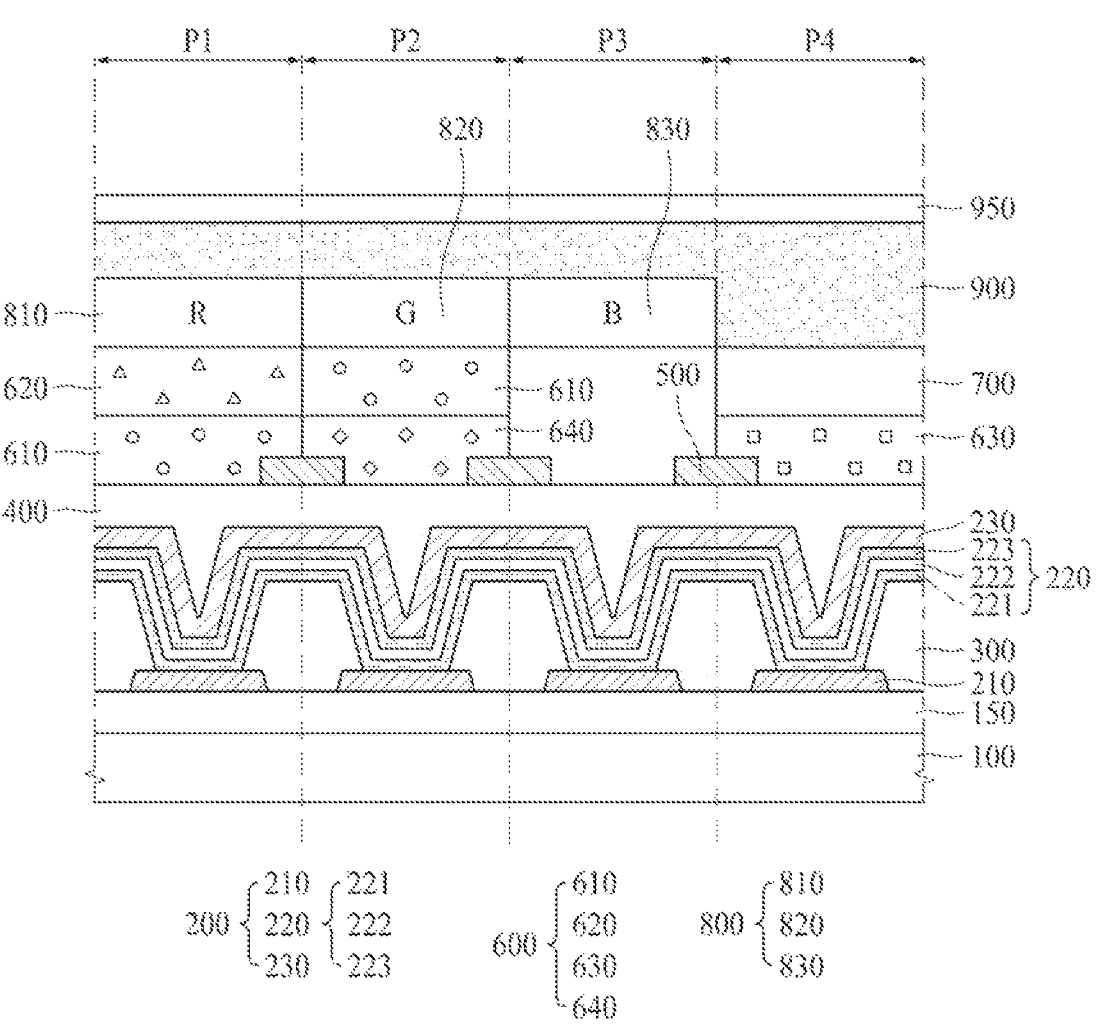
FIG. 5 is a cross-sectional view illustrating a display device according to a (3-1)th embodiment of the present disclosure.
Figure 6:
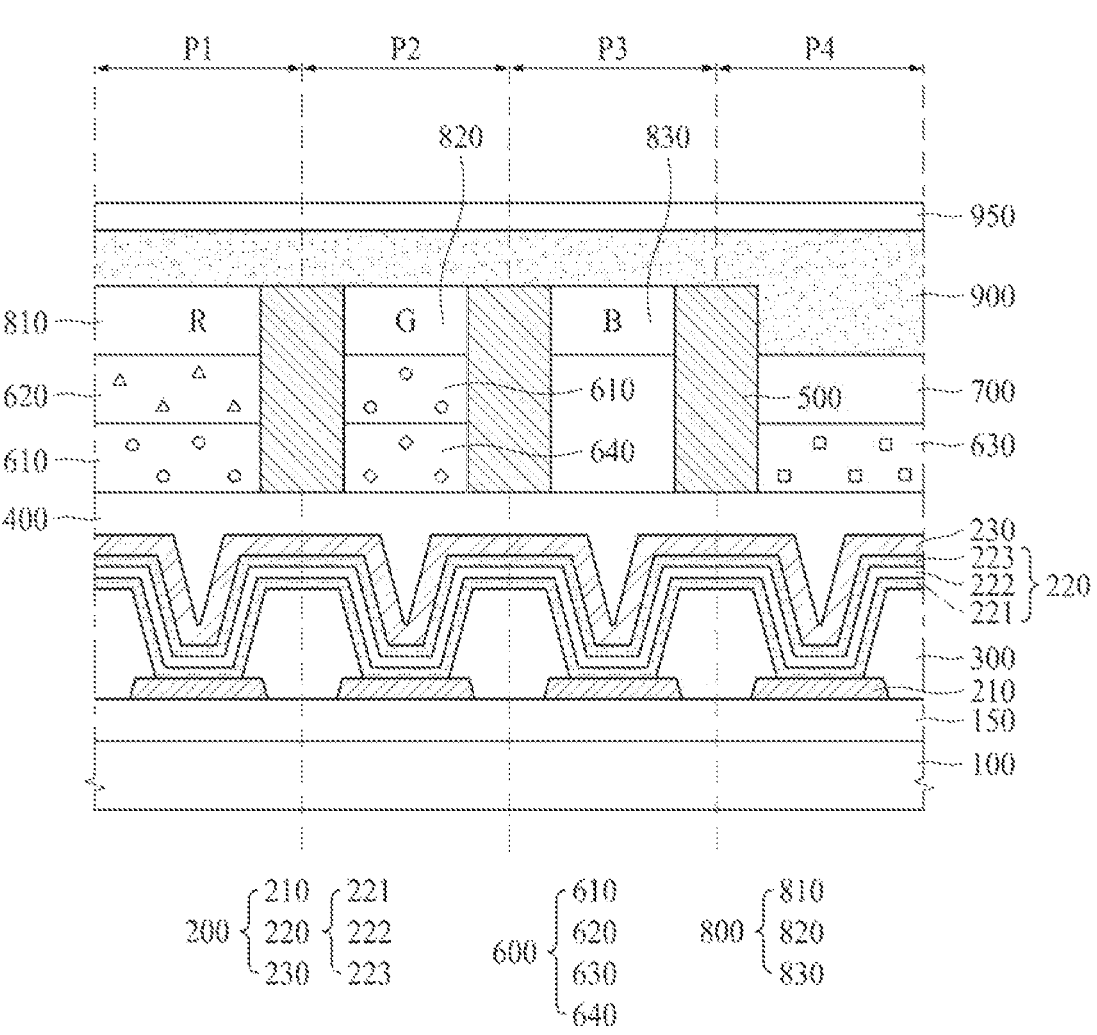
FIG. 6 is a cross-sectional view illustrating a display device according to a (3-2)th embodiment of the present disclosure.

FIG. 5 is a cross-sectional view illustrating a display device according to a (3-1)th embodiment of the present disclosure, and FIG. 6 is a cross-sectional view illustrating a display device according to a (3-2)th embodiment of the present disclosure.

The display device according to FIGS. 5 and 6 has substantially the same structure as that of the display device according to FIGS. 3 and 4 except for the structure of the second subpixel P2. Therefore, the same elements as those of the display device shown in FIGS. 3 and 4 are denoted by the same reference numerals and their repeated description will be omitted or may be briefly discussed.

Referring to FIGS. 5 and 6, the second subpixel P2 can include a first light conversion layer 610, a fourth light conversion layer 640 and a second color filter 820. In an area of the second subpixel P2, the fourth light conversion layer 640 can be formed on the encapsulation layer 400 and the black matrix 500, the first light conversion layer 610 can be formed on the fourth light conversion layer 640, and the second color filter 820 can be formed on the first light conversion layer 610.

The fourth light conversion layer 640 can be formed of the same material and thickness as those of the second and third light conversion layers 620 and 630. For example, in the same manner as the second and third light conversion layers 620 and 630, the fourth light conversion layer 640 can absorb green (G) light and convert the green (G) light into red (R) light to emit the red (R) light. At this time, light conversion rates of the fourth light conversion layer 640 and the second or third light conversion layer 620 or 630 can be the same as or different from each other. For example, in the same manner as the third light conversion layer 630, the fourth light conversion layer 640 can absorb only a portion of the green (G) light emitted from the second light emitting layer 222 and convert the portion of the green (G) light into red (R) right to emit the red (R) light. The light conversion rates of the fourth light conversion layer 640 and the third light conversion layer 630 can be the same as each other but are not limited thereto. For example, the light conversion rate of the fourth light conversion layer 640 can be greater than that of the third light conversion layer 630.

Therefore, the blue (B) light emitted from the first and third light emitting layers 221 and 223 can be emitted as it is by transmitting the fourth light conversion layer 640. A portion of the green (G) light emitted from the second light emitting layer 222 can be absorbed by the fourth light conversion layer 640 and converted into the red (R) light, whereby the red (R) light can be emitted. The other portion of the green (G) light emitted from the second light emitting layer 222 can be emitted as it is by transmitting the fourth light conversion layer 640. For example, in the fourth subpixel P4, the light that has passed through the fourth light conversion layer 640 can be the light in which the blue (B) light emitted from the first emission layer 221, the green (G) light emitted from the second emission layer 222 and the red (R) light converted by the fourth light conversion layer 640 are mixed.

In addition, reflectance due to external light is increased by light of a green (G) wavelength range among external light. However, in case of the present disclosure, green (G) light introduced from the outside is converted into red (R) light by the fourth light conversion layer 640, whereby reflectance can be reduced.

The first light conversion layer 610 formed in the second subpixel P2 can be formed of the same material and thickness as those of the first light conversion layer 610 formed in the first subpixel P1. For example, in the same manner as the first light conversion layer 610 formed in the first subpixel P1, the first light conversion layer 610 formed in the second subpixel P2 can absorb blue (B) light and convert the blue light into green (G) light to emit the green (G) light. Therefore, the blue (B) light emitted from the first light emitting layer 221 can be absorbed by the first light conversion layer 610 and converted into green (G) light to emit the green (G) light. In addition, the green (G) light emitted from the second light emitting layer 222 can be emitted as it is without being converted into another color. In addition, the red (R) light converted by the third light conversion layer 630 can be emitted as it is without being converted into another color. For example, in the second subpixel P2, the light that has passed through the first light conversion layer 610 can be the light in which the green (G) light and the red (R) light are mixed. In this case, the amount of the green (G) light can be greater than the amount of the red (R) light.

The second color filter 820 can transmit only green (G) light. As described above, since most of the light that has passed through the first and fourth light conversion layers 610 and 640 is green (G) light, most of the light that has passed through the first and fourth light conversion layers 610 and 640 can transmit the second color filter 820. In addition, when light of a color different from the green (G) exists, the light of a color different from the green (G) can be shielded by the second color filter 820. Therefore, the second subpixel P2 can emit the green (G) light by the second color filter 820.

Therefore, as compared with the (2-1)th and (2-2)th embodiments of the present disclosure, in the (3-1)th and (3-2)th embodiments, a fourth light conversion layer 640 for converting green (G) light into red (R) light can be further formed in the second subpixel P2, so that green (G) light introduced from the outside can be converted into red (R) light, whereby reflectance due to external light can be more reduced. Therefore, reflectance of the green (G) light is reduced so that green reflection visibility of the display device is reduced, whereby black representation of the display device can be more advantageous. In addition, as compared with the (2-1)th and (2-2)th embodiments of the present disclosure, in the (3-1)th and (3-2)th embodiments, since reflectance of external light can be further reduced, light efficiency of the display device can be further improved.

Also, the fourth light conversion layer 640 has been described as absorbing only a portion of green (G) light and converting the portion of the green (G) light into red (R) light to emit the red (R) light, but is not limited thereto. For example, in the same manner as the second light conversion layer 620, the fourth light conversion layer 640 can fully absorb the green (G) light emitted from the second light emitting layer 222 and convert the green (G) light into red (R) light to emit the red light. For example, the light conversion rates of the fourth light conversion layer 640 and the second light conversion layer 620 can be the same as each other.

FIGS. 7A to 7F are cross-sectional views illustrating process steps of a display device according to the (1-1)th embodiment of the present disclosure.

Figure 7A:
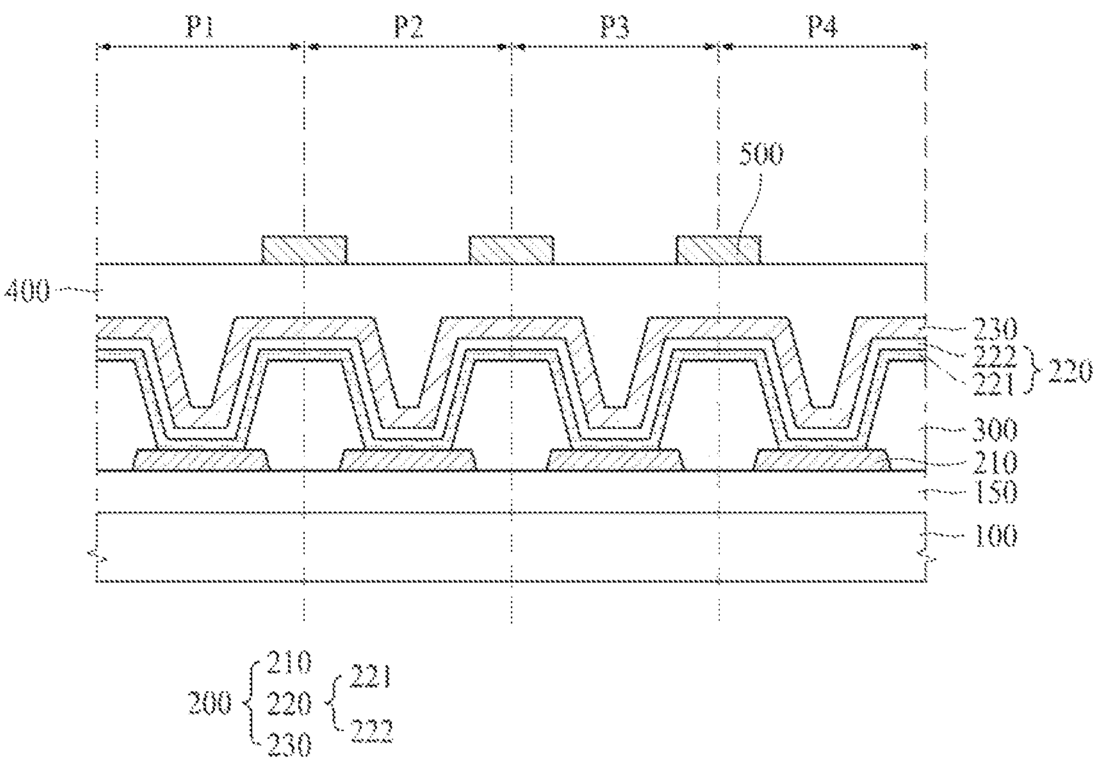
FIGS. 7A to 7F are cross-sectional views illustrating process steps of a display device according to the (1-1)th embodiment of the present disclosure.

Referring to FIG. 7A, a circuit element layer 150, a light emitting element 200, a bank 300, an encapsulation layer 400 and a black matrix 500 can be sequentially formed on a substrate 100.

First to fourth subpixels P1 to P4 can be formed on the substrate 100. The first subpixel P1 can be formed to emit red (R) light, the second subpixel P2 can be formed to emit green (G) light, the third subpixel P3 can be formed to emit blue (B) light, and the fourth subpixel P4 can be formed to emit white (W) light, but the present disclosure is not limited thereto. Various modifications can be made in the arrangement order of the first to fourth subpixels P1 to P4.

The circuit element layer 150 can be formed on the substrate 100. The circuit element layer 150 can be provided with a circuit element, which includes various signal lines, a thin film transistor and a capacitor, for each of the subpixels P1 to P4.

The light emitting element 200 can be formed on the circuit element layer 150. The light emitting element 200 can include a first electrode 210, a light emitting layer 220, and a second electrode 230.

The first electrode 210 can be formed on the circuit element layer 150. The first electrode 210 is formed in each of the first to fourth subpixels P1 to P4, and can serve as an anode of the display device. The first electrode 210 can be electrically connected to the driving thin film transistor formed in the circuit element layer 150.

The bank 300 can be formed at a boundary between the first to fourth subpixels P1 to P4 to define a light emission area in each of the first to fourth subpixels P1 to P4. For example, an opening area in which the bank 300 is not formed in each of the first to fourth subpixels P1 to P4 can be a light emission area. In addition, the bank 300 can be formed to cover an end of the first electrode 210.

The light emitting layer 220 can be formed on the first electrode 210. In addition, the light emitting layer 220 can be also formed on the bank 300, and thus can be continuously formed in the first to fourth subpixels P1 to P4 and a boundary area therebetween.

The light emitting layer 220 can include a first light emitting layer 221 and a second light emitting layer 222. The first light emitting layer 221 can be formed on the first electrode 210, and the second light emitting layer 222 can be formed on the first light emitting layer 221.

Each of the first and second light emitting layers 221 and 222 can include a hole transport layer, an organic light emitting layer and an electron transport layer. In this case, when a voltage is applied to the first electrode 210 and the second electrode 230, holes and electrons can move to the light emitting layer 220 through the hole transport layer and the electron transport layer, respectively and are combined with each other in the light emitting layer 220 to emit light.

The first light emitting layer 221 and the second light emitting layer 222 can emit light of different colors. The first light emitting layer 221 can emit blue (B) light, and the second light emitting layer 222 can emit green (G) light, but the present disclosure is not limited thereto.

The second electrode 230 can be formed on the light emitting layer 220. The second electrode 230 can serve as a cathode of the display device. In the same manner as the light emitting layer 220, the second electrode 230 can be formed in the first to fourth subpixels P1 to P4 and the boundary area therebetween. For example, the second electrode 230 can be also formed on the first electrode 210 and the bank 300.

The encapsulation layer 400 can be formed on the second electrode 230 to prevent external moisture from being permeated into the light emitting layer 220.

The black matrix 500 can be formed on the encapsulation layer 400. The black matrix 500 can be formed at the boundary between the first to fourth subpixels P1 to P4 in a matrix structure to prevent light leakage from occurring at the boundary between the first to fourth subpixels P1 to P4.

Figure 7B:
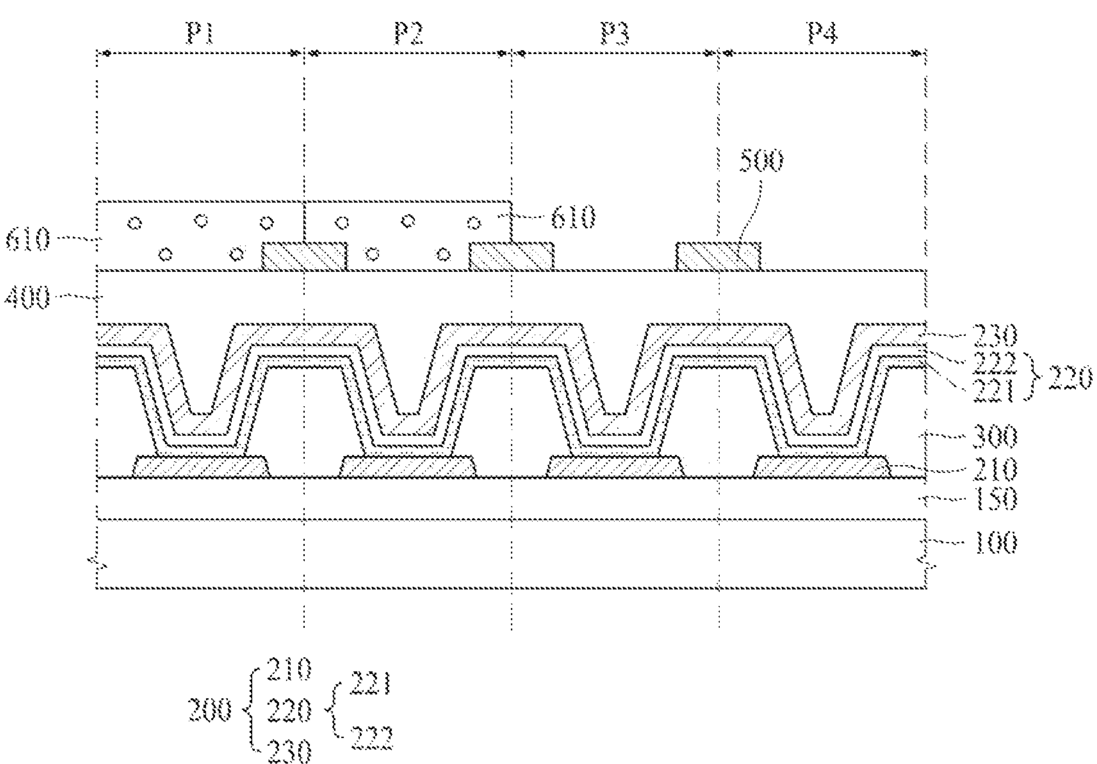

Referring to FIG. 7B, a first light conversion layer 610 can be formed on the encapsulation layer 400 and the black matrix 500.

The first light conversion layer 610 can be formed in the first and second subpixels P1 and P2. The first light conversion layer 610 can absorb blue (B) light and convert the blue light into green (G) light to emit the green light. The first light conversion layers 610 respectively formed in the first and second subpixels P1 and P2 can be formed of the same material and thickness, but are not limited thereto.

Figure 7C:
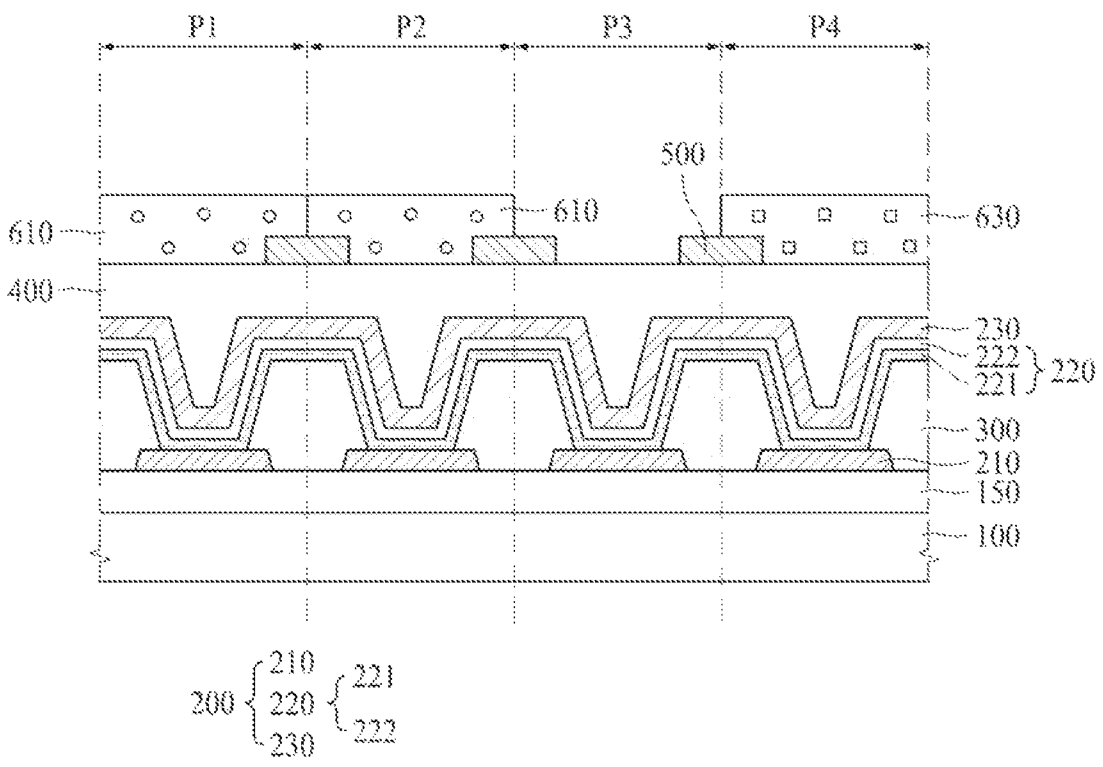

Referring to FIG. 7C, a third light conversion layer 630 can be formed on the encapsulation layer 400 and the black matrix 500.

The third light conversion layer 630 can be formed in the fourth subpixel P4. The third light conversion layer 630 can absorb only a portion of the green (G) light and convert the green light into red (R) light to emit the red (R) light.

Figure 7D:
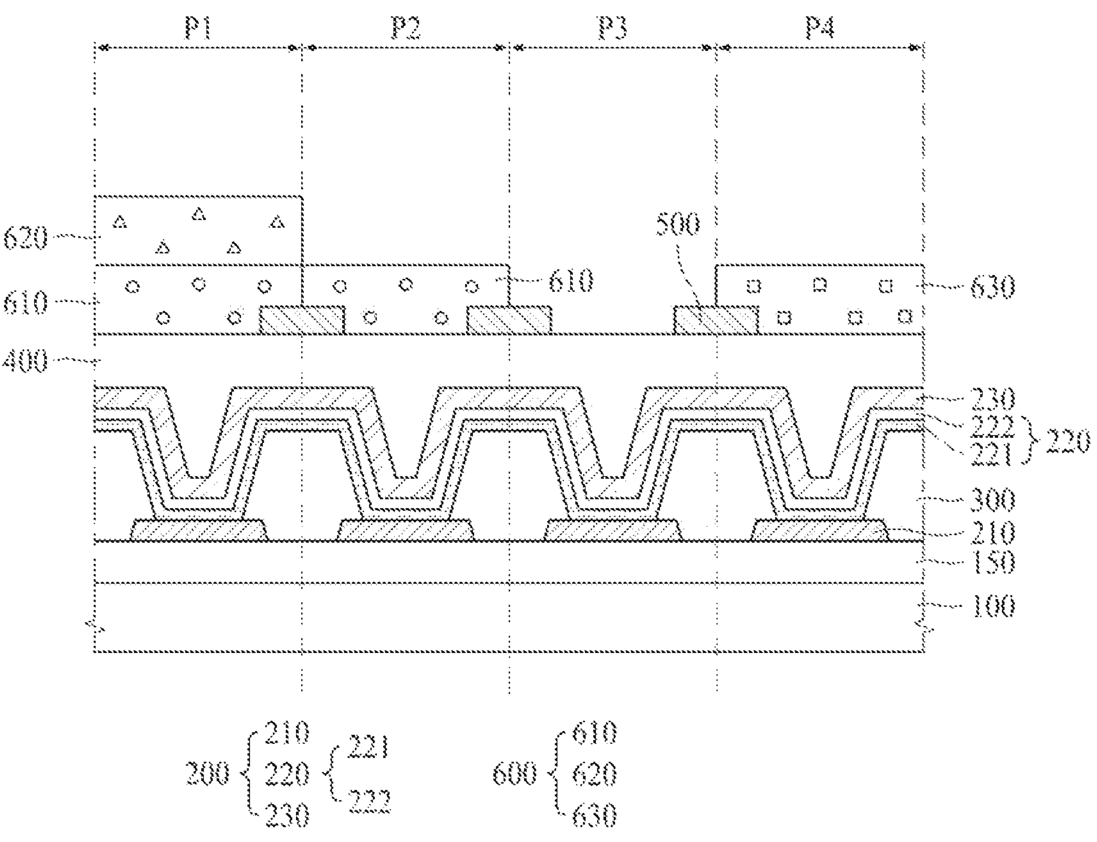

Referring to FIG. 7D, a second light conversion layer 620 can be formed on the first light conversion layer 610 of the first subpixel P1. The second light conversion layer 620 can emit light of a color different from that of the first light conversion layer 610, and the second light conversion layer 620 can fully convert the green (G) light into red (R) light to emit the red light.

Figure 7E:
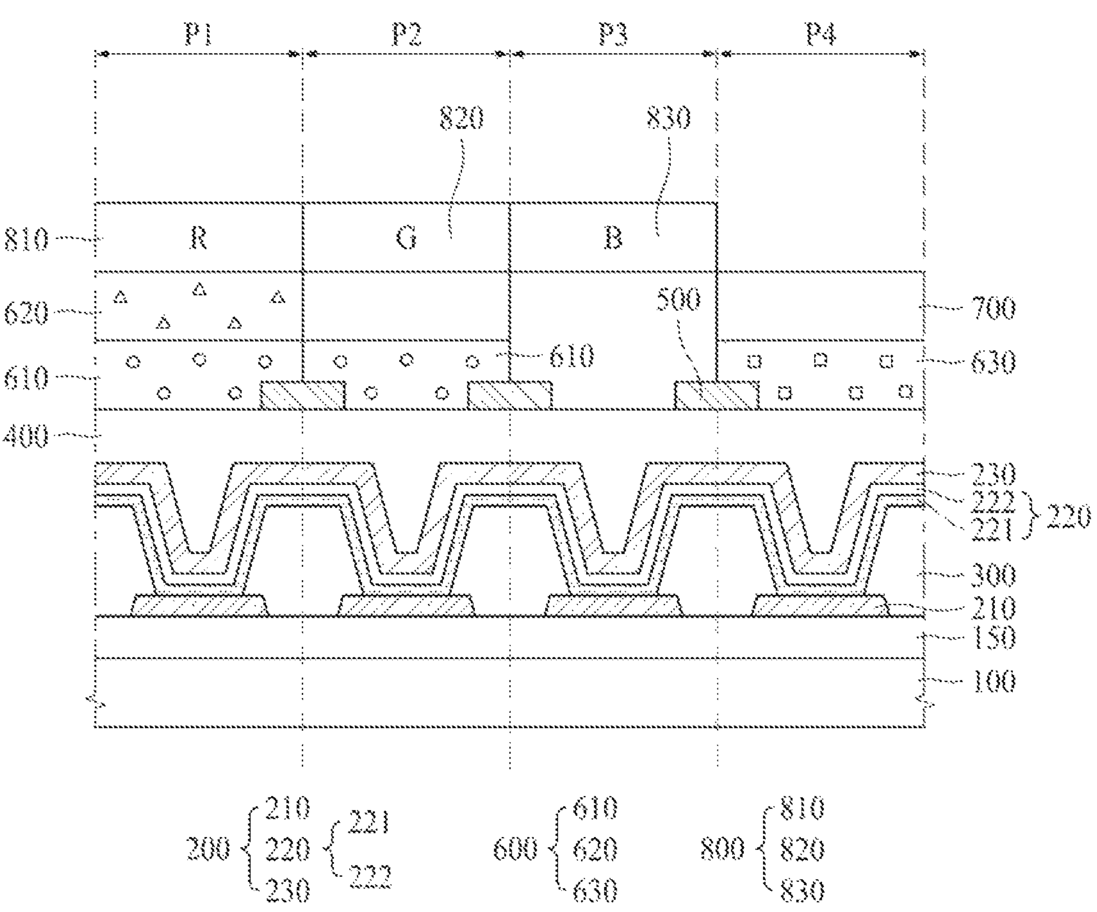

Referring to FIG. 7E, a transparent layer 700 and a color filter 800 can be formed on the encapsulation layer 400, the black matrix 500 and the light conversion layer 600.

The transparent layer 700 can be formed in the second to fourth subpixels P2 to P4. A thickness of the transparent layer 700 formed in the second and fourth subpixels P2 and P4 can be the same as that of the second light conversion layer 620, but is not limited thereto. In addition, the thickness of the transparent layer 700 formed in the third subpixel P3 can be the same as a sum of the thicknesses of the first and second light conversion layers 610 and 620, but is not limited thereto. A step difference may not be formed between an upper surface of the second light conversion layer 620 and an upper surface of the transparent layer 700. For example, after the transparent layer 700 is formed, the uppermost surface of the substrate 100 can be flat.

The color filter 800 can be formed on the second light conversion layer 620 and the transparent layer 700. The first color filter 810 can be formed in the first subpixel P1 to transmit only red (R) light, the second color filter 820 can be formed in the second subpixel P2 to transmit only green (G) light, and the third color filter 830 can be formed in the third subpixel P3 to transmit only blue (B) light.

Figure 7F:
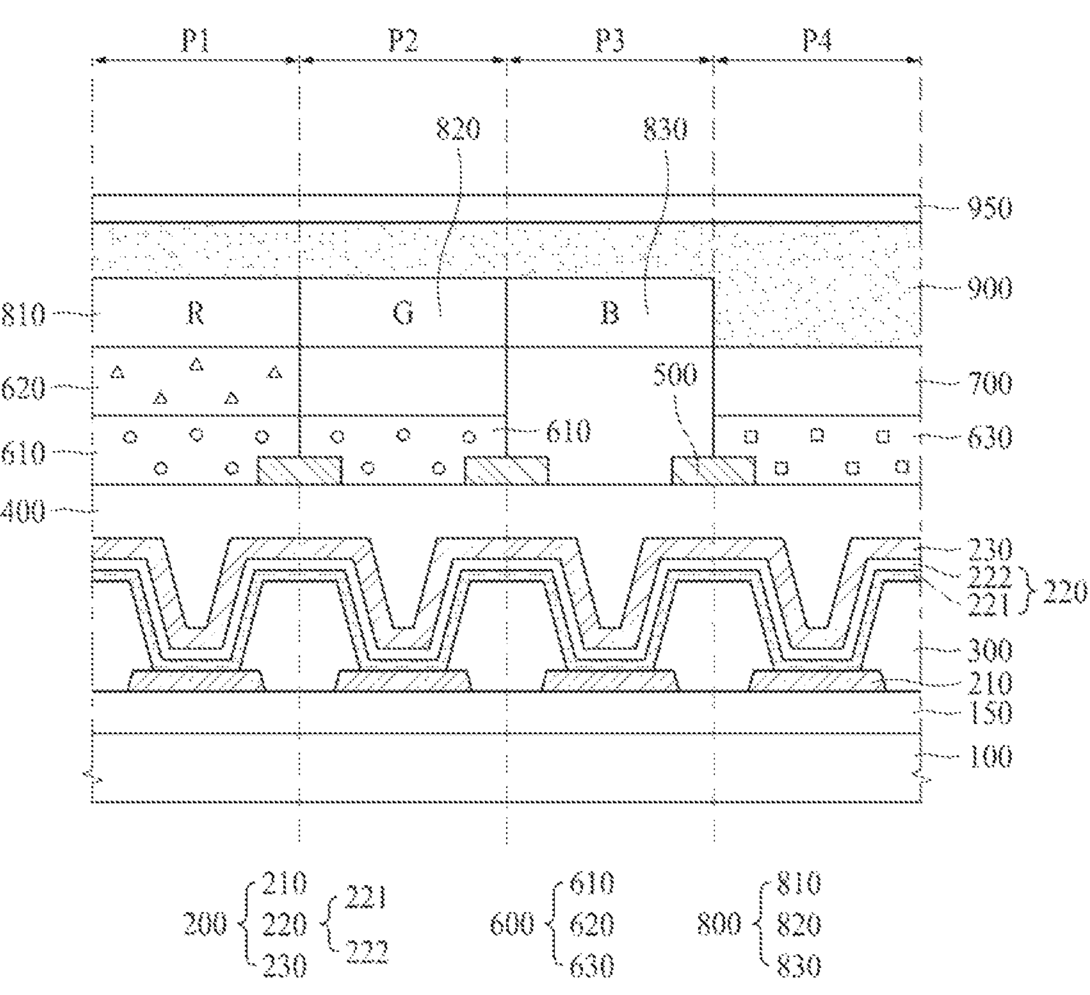

Referring to FIG. 7F, an adhesive 900 and an absorption film 950 can be formed on the transparent layer 700 and the color filter 800.

The adhesive 900 can be formed on an entire surface of the first to fourth subpixels P1 to P4 so that an upper surface of the adhesive 900 is flat. Since the color filter is not formed in the fourth subpixel P4 for emitting white (W) light, a thickness of the adhesive 900 formed in the fourth subpixel P4 can be greater than that of the adhesive 900 formed in the first to third subpixels P1 to P3. The absorption film 950 can be attached onto the adhesive 900, and can be formed on the entire surface of the first to fourth subpixels P1 to P4. In addition, the absorption film 950 can be stably attached to the transparent layer 700 and the color filter 800 by the adhesive 900.

FIGS. 8A to 8F are cross-sectional views illustrating process steps of a display device according to the (3-1)th embodiment of the present disclosure.

The process steps of the display device according to FIGS. 8A to 8F have substantially the same structure as that of the process steps of the display device according to FIGS. 7A to 7F except for the structure of the light emitting layer 220 and the second subpixel P2. Therefore, the same reference numerals will be used for the same elements as those in the process steps of the display device shown in FIGS. 7A to 7F, and their repeated description will be omitted or may be briefly discussed.

Figure 8A:
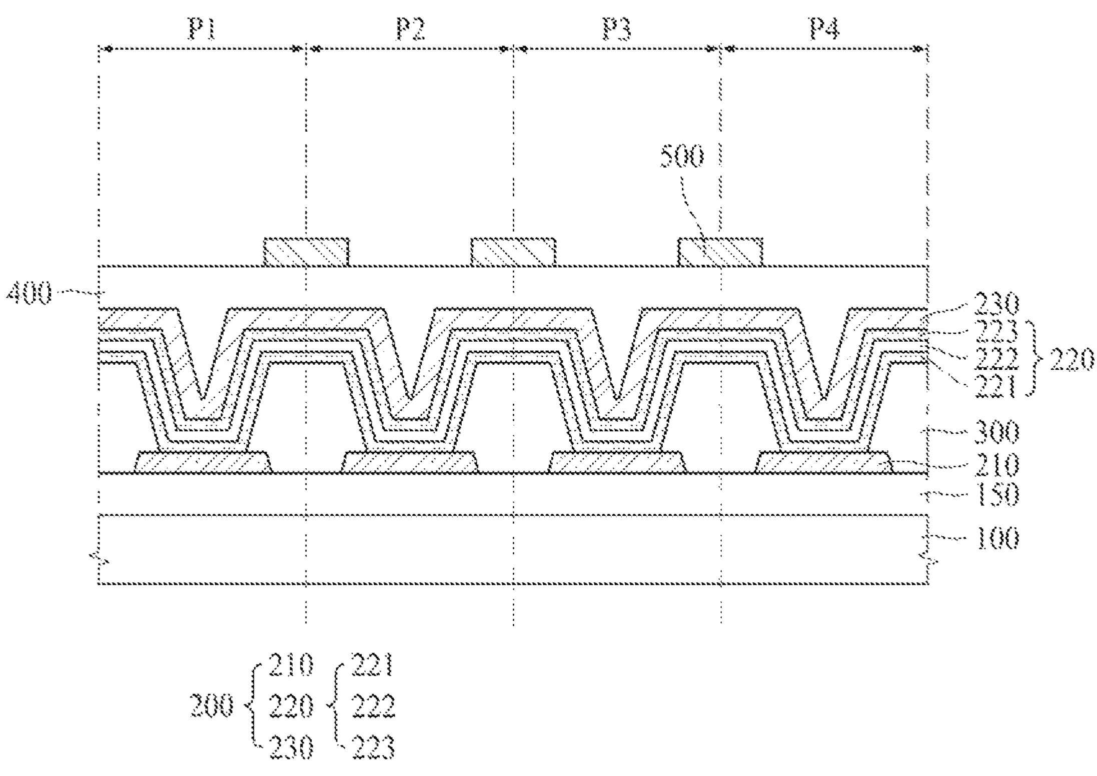
FIGS. 8A to 8F are cross-sectional views illustrating process steps of a display device according to the (3-1)th embodiment of the present disclosure.

Referring to FIG. 8A, a circuit element layer 150, a light emitting element 200, a bank 300, an encapsulation layer 400 and a black matrix 500 can be sequentially formed on a substrate 100. As described above, the light emitting element 200 can include a first electrode 210, a light emitting layer 220 and a second electrode 230. The light emitting layer 220 can be formed by sequentially stacking first to third light emitting layers 221, 222 and 223. The first light emitting layer 221 can emit blue (B) light, the second light emitting layer 222 can emit green (G) light, and the third light emitting layer 223 can emit blue (B) light.

Figure 8B:
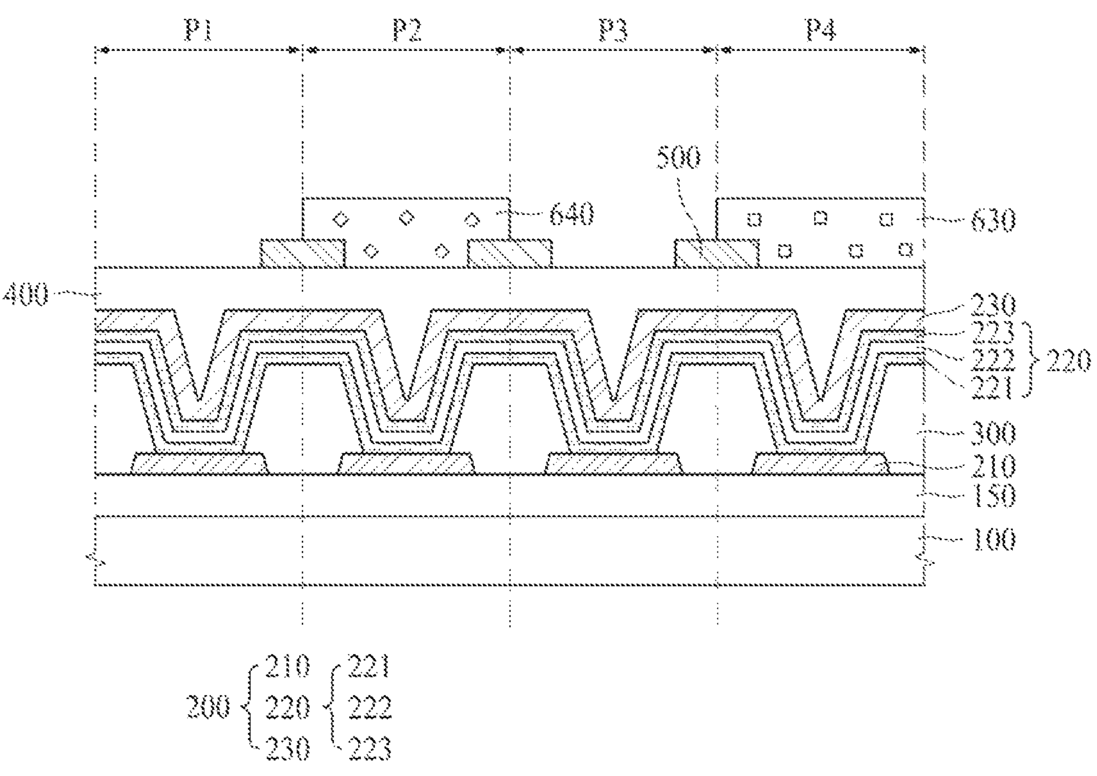

Referring to FIG. 8B, third and fourth light conversion layers 630 and 640 can be formed on the encapsulation layer 400 and the black matrix 500.

The third light conversion layer 630 can be formed in the fourth subpixel P4, and the fourth light conversion layer 640 can be formed in the second subpixel P2. The third and fourth light conversion layers 630 and 640 can be formed to have the same material and thickness. The third and fourth light conversion layers 630 and 640 can absorb green (G) light and convert the green (G) light into red (R) light to emit the red (R) light. In this case, light conversion rates of the third and fourth light conversion layers 630 and 640 can be different from or the same as each other. For example, the third and fourth light conversion layers 630 and 640 can absorb only a portion of the green (G) light and convert the absorbed green (G) light into red (R) light to emit the red (R) light. In this case, the light conversion rate of the fourth light conversion layer 640 can be greater than that of the third light conversion layer 630, but the present disclosure is not limited thereto.

Figure 8C:
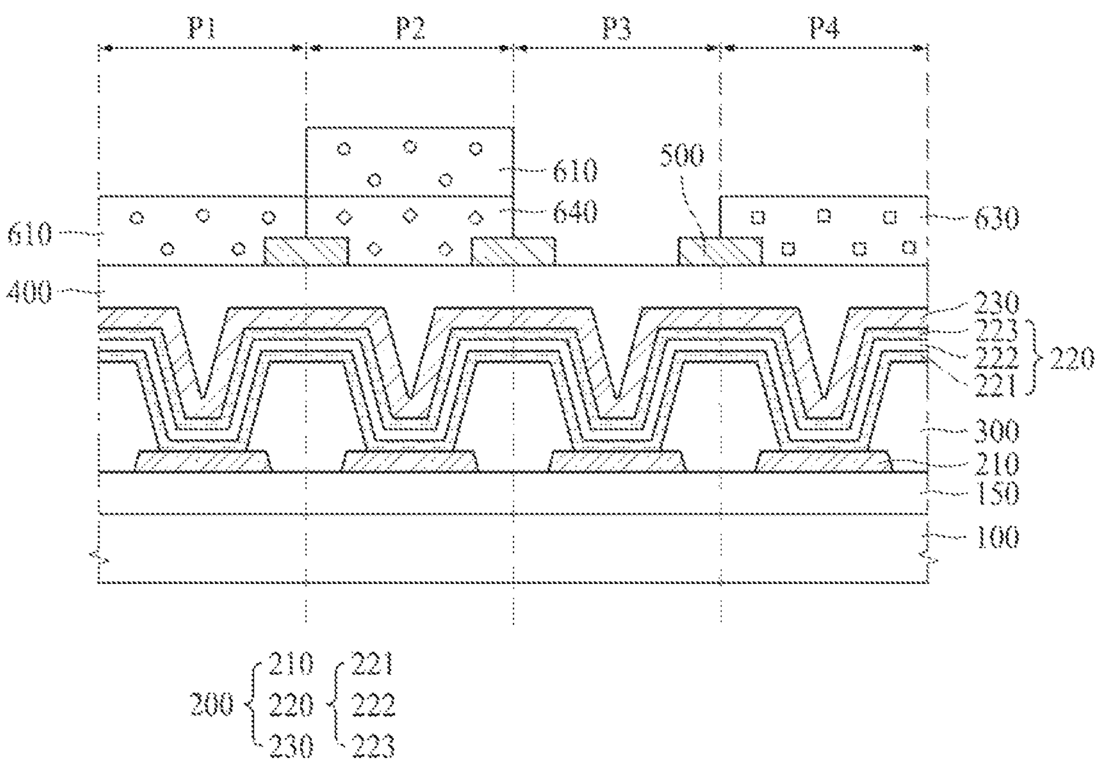

Referring to FIG. 8C, a first light conversion layer 610 can be formed on the fourth light conversion layer 640, the encapsulation layer 400 and the black matrix 500.

In the first subpixel P1, the first light conversion layer 610 can be formed on the encapsulation layer 400 and the black matrix 500. In addition, in the second subpixel P2, the first light conversion layer 610 can be formed on the fourth light conversion layer 640. As described above, the first light conversion layer 610 can absorb blue (B) light and convert the blue light into green (G) light to emit the green (G) light.

Figure 8D:
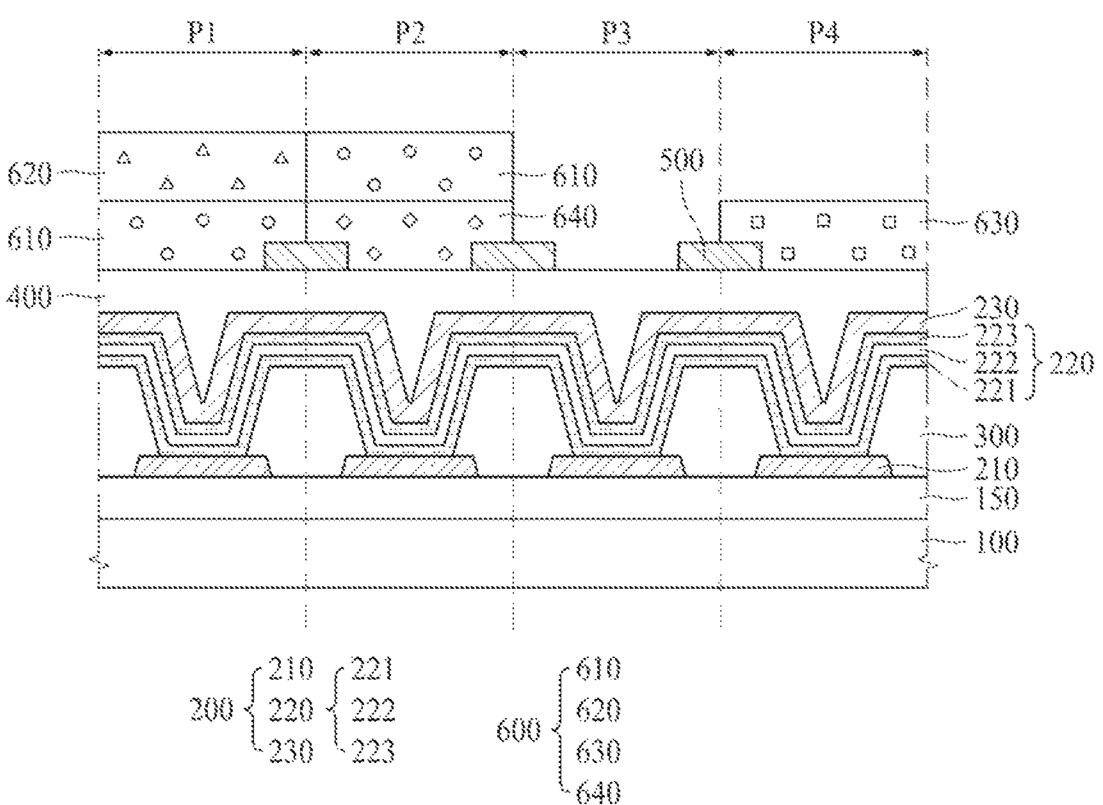

Referring to FIG. 8D, a second light conversion layer 620 can be formed on the first light conversion layer 610 of the first subpixel P1. As described above, the second light conversion layer 620 can emit light of a color different from that of the first light conversion layer 610, and the second light conversion layer 620 can fully convert the green light into red (R) light to emit the red (R) light. In addition, the light conversion rates of the second and fourth light conversion layers 620 and 640 can be the same as each other, but the present disclosure is not limited thereto. For example, the second and fourth light conversion layers 620 and 640 can convert all of the green (G) light into red (R) light and emit the red (R) light.

Figure 8E:
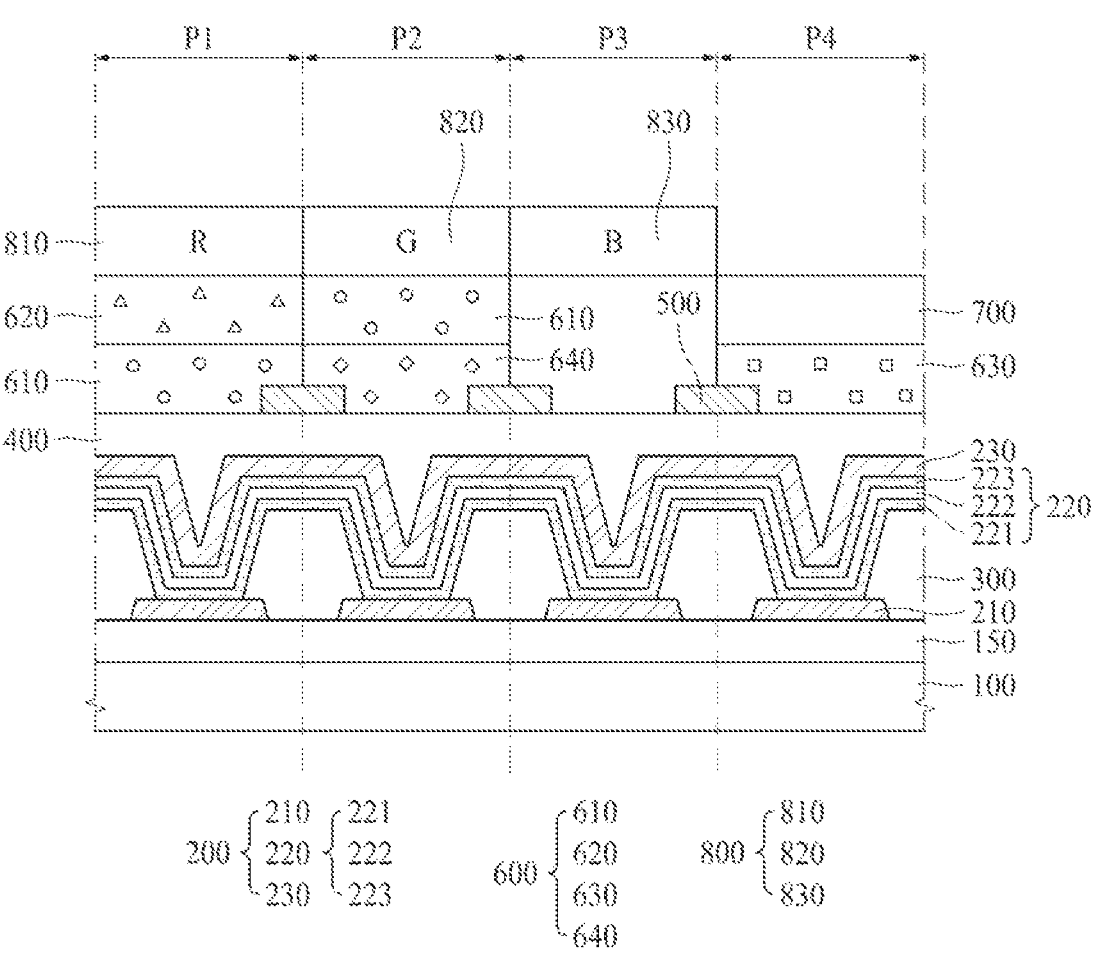
Figure 8F:
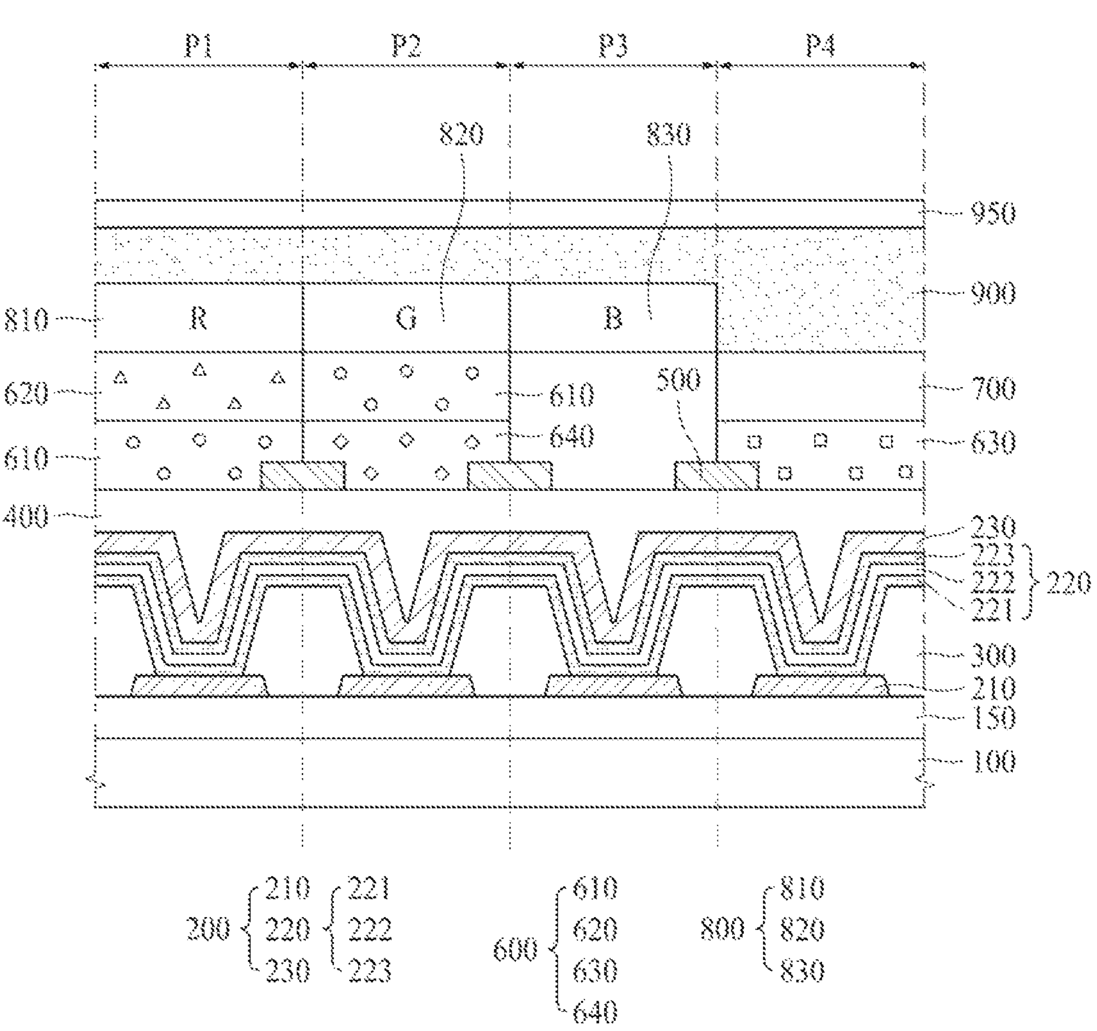

As described above with reference to FIG. 7E, the transparent layer 700 and the color filter 800 can be formed on the encapsulation layer 400, the black matrix 500 and the light conversion layer 600 even in FIG. 8E. Also, as described above with reference to FIG. 7F, the adhesive 900 and the absorption film 950 can be formed on the transparent layer 700 and the color filter 800 even in FIG. 8F.

According to the present disclosure, at least the following advantageous effects can be obtained.

According to one or more embodiments of the present disclosure, the plurality of light conversion layers can be formed so that light efficiency can be improved, and reflectance due to external light can be reduced.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display device comprising:

a substrate including first to fourth subpixels;

a light emitting element disposed on the substrate;

a plurality of light conversion layers disposed on the light emitting element; and a plurality of color filters disposed on the plurality of light conversion layers, wherein the plurality of light conversion layers include first and second light conversion layers configured to emit light of different colors, wherein in the first subpixel, the first light conversion layer is disposed on the light emitting element and the second light conversion layer is disposed on the first light conversion layer, and wherein the first light conversion layer is also disposed on the second subpixel.

2. The display device of claim 1, wherein the light emitting element includes:

a first light emitting layer disposed on the substrate, and configured to emit blue light; and a second light emitting layer disposed on the first light emitting layer, and configured to emit green light.

3. The display device of claim 2, further comprising a third light emitting layer, wherein the third light emitting layer is disposed on the second light emitting layer and is configured to emit blue light.

4. The display device of claim 1, wherein the first light conversion layer absorbs blue light and converts the blue light into green light to emit the green light, and the second light conversion layer absorbs green light and converts the green light into red light to emit the red light.

5. The display device of claim 1, wherein, in the second subpixel, the first light conversion layer is disposed on the light emitting element.

6. The display device of claim 1, wherein the plurality of light conversion layers further include a fourth light conversion layer configured to emit light of a color different from the color of light emitted from the first light conversion layer, and in the second subpixel, the fourth light conversion layer is disposed on the light emitting element and the first light conversion layer is disposed on the fourth light conversion layer.

7. The display device of claim 6, wherein the fourth light conversion layer absorbs green light and converts the green light into red light to emit the red light.

8. The display device of claim 7, wherein the fourth light conversion layer absorbs a portion of the green light emitted from the light emitting element, converts an absorbed portion of the green light into red light to emit the red light, and transmits a remaining portion of the green light.

9. The display device of claim 1, wherein the plurality of light conversion layers further include a third light conversion layer disposed in the fourth subpixel, and the third light conversion layer absorbs green light and converts the green light into red light to emit the red light.

10. The display device of claim 9, wherein the third light conversion layer absorbs a portion of the green light emitted from the light emitting element to convert an absorbed portion of the green light into red light, and transmits a remaining portion of the green light.

11. The display device of claim 1, wherein the plurality of color filters include first to third color filters, the first color filter is disposed in the first subpixel to transmit red light, the second color filter is disposed in the second subpixel to transmit green light, and the third color filter is disposed in the third subpixel to transmit blue light.

12. The display device of claim 11, wherein the first subpixel emits the red light, the second subpixel emits the green light, the third subpixel emits the blue light, and the fourth subpixel emits white light.

13. The display device of claim 1, further comprising:

an absorption film disposed on an entire surface of the first to fourth subpixels.

* * * * *